(12) United States Patent
Qin

(10) Patent No.: US 12,402,457 B2
(45) Date of Patent: Aug. 26, 2025

(54) LIGHT-EMITTING PANEL, METHOD FOR FABRICATING THE LIGHT-EMITTING PANEL, AND DISPLAY DEVICE

(71) Applicant: Shanghai Tianma Microelectronics Co., Ltd., Shanghai (CN)

(72) Inventor: Xuefei Qin, Shanghai (CN)

(73) Assignee: SHANGHAI TIANMA MICROELECTRONICS CO., LTD., Shanghai (CN)

( * ) Notice: Subject to any disclaimer, the term of this patent is extended or adjusted under 35 U.S.C. 154(b) by 799 days.

(21) Appl. No.: 17/721,385

(22) Filed: Apr. 15, 2022

(65) Prior Publication Data

US 2023/0246145 A1  Aug. 3, 2023

(30) Foreign Application Priority Data

Jan. 29, 2022  (CN) .......................... 202210111537.X

(51) Int. Cl.
   *H10H 20/856* (2025.01)
   *H01L 25/075* (2006.01)
   *H10H 20/01* (2025.01)

(52) U.S. Cl.
   CPC ....... *H10H 20/856* (2025.01); *H01L 25/0753* (2013.01); *H10H 20/0363* (2025.01)

(58) Field of Classification Search
   CPC .... H10H 20/856; H10H 20/84; H10H 29/842; H10K 50/856; H10K 50/84; H05B 33/24
   See application file for complete search history.

(56) References Cited

U.S. PATENT DOCUMENTS

2017/0338388 A1* 11/2017 Wu ..................... H10H 20/8506

FOREIGN PATENT DOCUMENTS

CN    110370770 A    10/2019
KR    102125313 B1    6/2020

* cited by examiner

*Primary Examiner* — Amar Movva
(74) *Attorney, Agent, or Firm* — East IP P.C.

(57) ABSTRACT

A light-emitting panel, a method for fabricating a light-emitting panel, and a display device are provided in embodiments of the present application. The light-emitting panel includes: a substrate, and a plurality of light-emitting elements, a reflective layer and a protective layer that are disposed at a side of the substrate, wherein the reflective layer is located between the substrate and the protective layer; and wherein both the protective layer and the reflective layer are provided with openings, the substrate includes bonding points within the openings, and the light-emitting elements are electrically connected to the bonding points.

20 Claims, 10 Drawing Sheets

LIGHT-EMITTING PANEL, METHOD FOR FABRICATING THE LIGHT-EMITTING PANEL, AND DISPLAY DEVICE

CROSS-REFERENCE TO RELATED APPLICATION

The present application is based upon and claims priority to Chinese Patent Application No. 202210111537.X, filed on Jan. 29, 2022, which is incorporated herein by reference in its entirety.

TECHNICAL FIELD

The present application relates to the field of display technology, and in particular to a light-emitting panel, a method for fabricating the light-emitting panel, and a display device.

BACKGROUND

With development of display technology, there are more and more types of light-emitting panels. For example, the light-emitting panels may include a light-emitting diode (LED) light-emitting panel, a sub-millimeter light-emitting diode (Mini LED) light-emitting panel, and a micro light-emitting diode (Micro LED) light-emitting panel, and the like.

In order to improve a light-outputting effect of a light-emitting panel, generally a reflective layer with a higher reflectivity, such as white reflective ink, may be applied on a surface of a substrate in the light-emitting panel to improve the light-outputting effect of the light-emitting panel through reflection by the reflective layer of light emitted by light-emitting elements on the substrate.

However, inventors of the present application have found that the reflective layer at positions of bonding points is prone to yellowing during a bonding process of the light-emitting elements, resulting in a poorer light-outputting effect of the light-emitting panel.

SUMMARY

The embodiments of the present application provide a light-emitting panel, a method for fabricating the light-emitting panel, and a display device.

In a first aspect, according to the embodiments of the present application, there is provided a light-emitting panel, including: a substrate, and a plurality of light-emitting elements, a reflective layer and a protective layer that are disposed at a side of the substrate, wherein the reflective layer is located between the substrate and the protective layer; and wherein both the protective layer and the reflective layer are provided with openings, the substrate includes bonding points within the openings, and the light-emitting elements are electrically connected to the bonding points.

In a second aspect, according to the embodiments of the present application, there is provided a method for fabricating a light-emitting panel, wherein the light-emitting panel includes the light-emitting panel according to the first aspect. The method includes: providing a substrate on which bonding points are provided; forming a reflective layer at a side of the substrate where the bonding points are located; forming a protective layer at a side of the reflective layer that is away from the substrate, and forming openings on both the protective layer and the reflective layer to expose the bonding points; and electrically connecting light-emitting elements to the bonding points.

In a third aspect, according to the embodiments of the present application, there is provided a display device, including the light-emitting panel according to the first aspect.

BRIEF DESCRIPTION OF THE DRAWINGS

In order to illustrate technical solutions of the embodiments of the present application more clearly, the drawings required for the embodiments of the present application will be briefly described. For a person skilled in the art, other drawings can be obtained from these drawings without any inventive effort.

DETAILED DESCRIPTION

Figure 1:
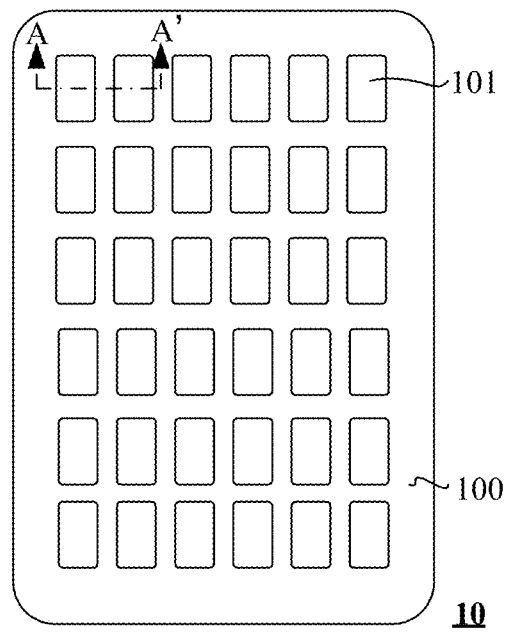
FIG. 1 is a schematic top view of a light-emitting panel according to an embodiment of the present application.

The features and exemplary embodiments of various aspects of the present application will be described in detail below. In order to make the purposes, technical solutions and advantages of the present application more clear, the present application will be further described in detail below with reference to the accompanying drawings and specific embodiments. It should be understood that the specific embodiments described herein are only intended to explain the present application, but not to limit the present application. It will be apparent to a person skilled in the art that the present application may be practiced without some of these specific details. The following description of the embodiments is merely to provide a better understanding of the present application by illustrating examples of the present application.

It should be noted that relational terms in this document such as first and second are used only to distinguish one entity or operation from another entity or operation, and do not necessarily require or imply such actual relationship or sequence between these entities or operations. Moreover, the terms "comprising", "including" or any other variation thereof are intended to encompass a non-exclusive inclusion such that a process, method, article or device that includes a list of elements not only includes those elements, but also includes other elements that are not explicitly listed but inherent to such a process, method, article or device. Without further limitation, an element defined by the term "comprising . . . " does not preclude presence of additional elements in a process, method, article or device that includes the element.

It should be understood that the term "and/or" used in this document indicates only an association relationship to describe the associated objects, which indicates that there may be three kinds of relationships, for example, "A and/or B" may indicate three cases, one indicating A along, another indicating B alone and yet another indicating both A and B. In addition, the character "/" in this document generally indicates that the associated objects are in an "or" relationship.

It should be understood that an orientation or positional relationship indicated by the terms "center", "longitudinal", "lateral", "length", "width", "thickness", "upper", "lower", "front", "rear", "left", "right", "vertical", "horizontal", "top", "bottom", "inside", "outside", "clockwise", "counterclockwise", etc. is an orientation or positional relationship based on that shown in the drawings, and is only provided for conveniently describing the present application and simplifying the description, rather than indicating or implying that the involved device or element must have a specific orientation and must be constructed and operated in a specific orientation, and therefore should not be construed as a limitation to the present application.

In the embodiments of the present application, the term "electrically connected" may refer to a direct electrical connection between two components, or may refer to an electrical connection between the two components via one or more other components.

It will be apparent to a person skilled in the art that various modifications and variations of the present application can be made without departing from spirits or scopes of the present application. Accordingly, the present application is intended to cover the modifications and variations of the present application that fall within scopes of corresponding claims (i.e. claimed technical solutions) and their equivalents. It should be noted that implementations according to the embodiments of the present application may be combined with each other as long as there is no contradiction.

Before describing the technical solutions according to the embodiments of the present application, the document first specifically describes problems existing in the related art in order to facilitate understanding of the embodiments of the present application.

As mentioned above, the inventors of the present application have found that there is a problem in the related art that the reflective layer is prone to yellowing and the light-emitting panel has a poorer light-outputting effect.

In order to solve the above-mentioned technical problems, the inventors of the present application has firstly conducted researches and made analyses on root causes of the above-mentioned technical problems. The researches and analyses are provided as follows.

For example, for a Mini LED light-emitting panel and a Micro LED light-emitting panel, it is impossible to use a traditional reflector plate to increase its reflectivity due to a smaller size of a light-emitting element (also known as an LED chip) in the light-emitting panel. Therefore, in order to improve a light-outputting effect of the light-emitting panel, it is general that a reflective layer with a higher reflectivity, such as white reflective ink, may be applied on a surface of a substrate in the light-emitting panel so that the reflective layer is used to reflect light emitted from the light-emitting elements, so as to improve the light-outputting effect of the light-emitting panel.

The white reflective ink is mainly composed of organic dispersant carriers and highly reflective particles. The inventors of the present application have found that during a bonding (such as welding) process of the light-emitting elements or a light-emitting process of the light-emitting elements (e.g. the light-emitting elements maintain light emission with a higher strength for a long time period), a surface of the white reflective ink will be oxidized, and organic components on the surface of the white reflective ink will be destroyed, resulting in yellowing of the surface of the white reflective ink. In this way, color of the surface of the white reflective ink will become darker, and a reflectivity of the surface of the white reflective ink will be reduced, which in turn leads to a poorer light-outputting effect of the light-emitting panel.

In addition, the inventors of the present application have found that due to poorer performance of the reflective layer (e.g. the white reflective ink) in isolating moisture, moisture in the air may easily intrude into the light-emitting elements and the substrate, leading that wirings or electronic devices in the light-emitting element and in the substrates may be easily corroded by moisture.

In view of the above findings from researches conducted by the inventors, the embodiments of the present application provide a light-emitting panel, a method for fabricating a light-emitting panel and a display device, which can at least solve the technical problems in the related art that the reflective layer is prone to yellowing and a light-outputting effect of the light-emitting panel is poorer.

A technical concept of the embodiments of the present application is to provide a protective layer at a side of the reflective layer that is away from the substrate, wherein the protective layer can play an anti-oxidation effect and/or a moisture isolation effect, with which oxidation of the reflective layer in the bonding process of the light-emitting elements and in the light-emitting process of the light-emitting elements can be reduced or even avoided, thereby reducing or even avoiding yellowing of the reflective layer and improving the light-outputting effect of the light-emitting panel; and in another hand, intrusion of moisture can be prevented as much as possible, thereby reducing or even avoiding corrosion of the wirings and electronic devices in the light-emitting elements and in the substrate.

In the embodiments of the present application, the light-emitting element may include, for example, a micro light-emitting diode Micro LED and a sub-millimeter light-emitting diode Mini LED. Correspondingly, the light-emitting panel may include a Micro LED light-emitting panel and a Mini LED light-emitting panel. Such light-emitting panel can be used for fabricating a self-luminous display panel and can be also used as a backlight panel.

The light-emitting panel according to the embodiments of the present application will be firstly described hereinafter.

Figure 2:
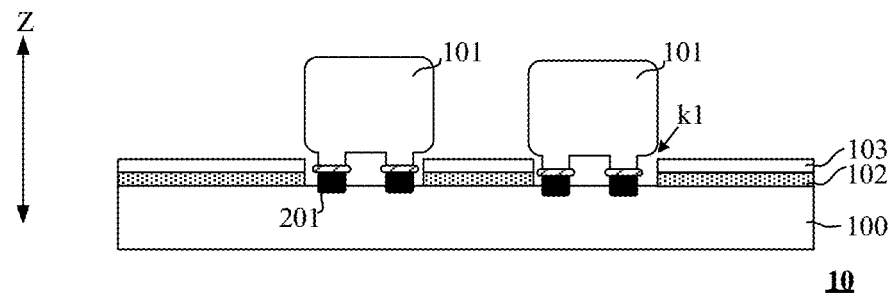
FIG. 2 is a schematic cross-sectional view of the light-emitting panel shown in FIG. 1 along a A-A' direction.

Referring to FIG. 1 and FIG. 2 where FIG. 1 is a schematic top view of a light-emitting panel according to an embodiment of the present application and FIG. 2 is a schematic cross-sectional view of the light-emitting panel shown in FIG. 1 along a A-A' direction, a light-emitting panel 10 according to the embodiment of the present application includes a substrate 100, and a plurality of light-emitting elements 101, a reflective layer 102 and a protective layer 103 at a side of the substrate 100. The substrate 100 may include, but is not limited to, a rigid substrate, and the rigid substrate may include, but is not limited to, a glass substrate, a printed circuit board (Printed Circuit Board, PCB) substrate or any other rigid substrate. The inventors of the present application have found that in a case where the substrate 100 is a glass substrate, there is a better feasibility in a practical application to provide the above mentioned layer structures (i.e., the reflective layer 102 and the protective layer 103) on the glass substrate due to better anti-deformation performance of the glass substrate.

In the embodiment of the present application, the reflective layer 102 may include, but is not limited to, white reflective ink (referred to as white ink), and in addition to the white reflective ink, the reflective layer 102 may be formed by any other material with a higher reflectivity, which is not limited herein. The protective layer 103 may have a single-layer structure or a stacked-layers structure, that is, the protective layer 103 may include merely one layer, or may include a plurality of stacked layers.

Still referring to FIG. 2, in a direction Z perpendicular to a plane where the light-emitting panel is located, the reflective layer 102 is located between the substrate 100 and the protective layer 103. That is, the protective layer 103 is disposed at a side of the reflective layer 102 that is away from the substrate 100, so as to protect the reflective layer 102 well. The substrate 100 is provided with bonding points 201 for bonding the light-emitting elements 101. The protective layer 103 and the reflective layer 102 are provided with openings k1, the bonding points 201 are disposed within the openings k1, and the light-emitting elements 101 are electrically connected by bonding with the bonding points 201. It should be understood that the bonding points 201 may only refer to bonding positions of the light-emitting elements 101, and do not represent physical structures; and alternatively, the bonding points 201 may be pad structures for bonding the light-emitting elements 101.

In a case where the protective layer 103 includes one layer, the protective layer 103 may be formed of a first material. It is easy to understand that an anti-oxidation capability of the first material may be greater than that of a material of the reflective layer 102 (e.g., the white reflective ink), so that an anti-oxidation capability of the protective layer 103 is greater than that of the reflective layer 102, and thus the protective layer 103 can play a better anti-oxidation effect. Exemplarily, the first material may include silicon nitride $SiN_x$ which has a better anti-oxidation capability, or the first material may include silicon oxynitride $SiN_xO_y$ which has both a better moisture absorption capability and a better anti-oxidation capability. In a case where the protective layer 103 includes a plurality of layers, the protective layer 103 may be formed of a plurality of materials, and some of the materials may have a better moisture absorption capability (e.g. MgO), and the remaining of the materials may have, for example, a better anti-oxidation capability (e.g. $SiN_x$).

In this way, since the protective layer 103 with a better anti-oxidation effect is provided at the side of the reflective layer 102 that is away from the substrate 100, a surface of the reflective layer 102 (e.g. the white reflective ink) will not be oxidized under protection of the protective layer 103 during a bonding (e.g. welding) process of the light-emitting elements 101 with the bonding points 201 or during a light-emitting process of the light-emitting elements 101 (for example, the light-emitting elements maintains light emission with a higher intensity for a long time period), thereby reducing or even avoiding yellowing of the surface of the reflective layer 102 and improving the light-outputting effect of the light-emitting panel 10.

In addition, a moisture isolation capability (also known as moisture absorption capability) of the first material may be greater than that of the material of the reflective layer 102 (e.g., the white reflective ink), so that a moisture isolation capability of the protective layer 103 is greater than that of the reflective layer 102, and thus the protective layer 103 can play a better moisture isolation effect. Exemplarily, the first material may include magnesium oxide MgO which has a better moisture absorption capability, or the first material may include silicon oxynitride $SiN_xO_y$ which has both a better moisture absorption capability and a better anti-oxidation capability. In the case where the protective layer 103 includes a plurality of layers, the protective layer 103 may be formed of a plurality of materials, and some of the materials may have a better moisture absorption capability (e.g., MgO), and the remaining of the materials may have, for example, a better anti-oxidation capability (e.g. $SiN_x$).

In this way, since the protective layer 103 has a better moisture isolation effect, it can prevent intrusion of moisture as much as possible, thereby reducing or even avoiding corrosion of wirings or electronic devices in the light-emitting element 101 and in the substrate 100.

It should be noted that it is easy for the above-mentioned exemplary materials for the first material, such as MgO, $SiN_x$ and $SiN_xO_y$, to form a dense layer structure in a film forming process, and thus an anti-oxidation effect and/or a moisture isolation effect can be attained.

The light-emitting panel 10 according to the embodiment of the present application includes the substrate 100, and the plurality of light-emitting elements 101, the reflective layer 102 and the protective layer 103 that are disposed at a side of the substrate 100, wherein the reflective layer 102 is located between the substrate 100 and the protective layer 103; and wherein both the protective layer 103 and the reflective layer 102 are provided with the openings k1, the substrate 100 includes bonding points 201 within the openings k1, and the light-emitting elements 101 are electrically connected to the bonding points 102. In the present application, by providing the protective layer 103 at the side of the reflective layer 102 that is away from the substrate 100, the protective layer 103 can play an anti-oxidation effect, which can reduce or even avoid oxidation of the reflective layer 102 in a bonding process of the light-emitting elements 101 and in a light-emitting process of the light-emitting elements 101, thereby reducing or even avoiding yellowing of the reflective layer 102 and improving the light-outputting effect of the light-emitting panel 10; and/or the protection layer 103 can plays a moisture isolation effect, which prevents intrusion of moisture as much as possible, thereby reducing or even avoiding corrosion of the wirings and electronic devices in the light-elements 101 and in the substrate 100.

Figure 3:
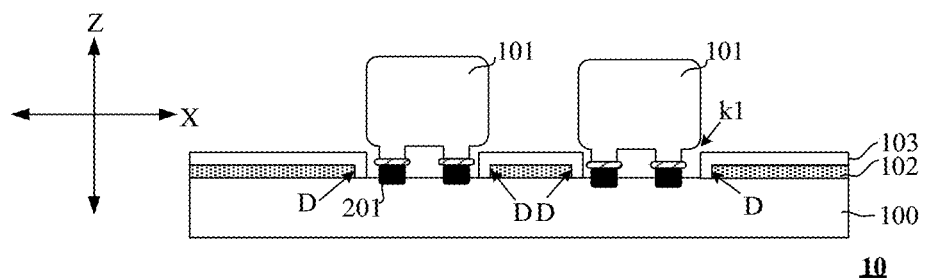
FIG. 3 is another schematic cross-sectional view of the light-emitting panel shown in FIG. 1 along the A-A' direction.

FIG. 3 is another schematic cross-sectional view of the light-emitting panel shown in FIG. 1 along the direction A-A'. As shown in FIG. 3, according to some embodiments of the present application, optionally, the protective layer 103 may cover side faces D of the reflective layer 102 that are close to the bonding points 201. The side faces D of the reflective layer 102 can be specifically understood as side faces (or surfaces) of the reflective layer 102 that are close to the bonding points 201 in the first direction X.

In this way, since the protective layer 103 covers the side faces D of the reflective layer 102 that are close to the bonding points 201, the side faces D can be prevented from being exposed to the air, thereby oxidation and yellowing of the side faces D of the reflective layer 102 and areas adjacent to the side faces D can be prevented, so as to ensure that the light-emitting panel 10 has a better light-outputting effect. In addition, intrusion of moisture through the side faces D can also be prevented, which further reducing or even avoiding corrosion of wirings or electronic device in the light-emitting element 101 and in the substrate 100.

The inventors of the present application have further found that provision of the protective layer 103 at the side of the reflective layer 102 that is away from the substrate 100 can enable that the light-emitting panel 10 has a better anti-oxidation effect and/or a moisture isolation effect, but may cause a reflectivity of the reflective layer 102 to be greatly reduced. For example, the inventors of the present application have found through a large number of experiments that the reflectivity of the reflective layer 102 (such as the white reflective ink with a thickness of 30 μm) that is actually measured is 83.05% and the reflectivity of the reflective layer 102 (e.g. the white reflective ink with a thickness of 30 μm) that is obtained by a simulation software is 82.52% when the protective layer 103 has not be applied. However, in a case where the protective layer 103 is a single layer of $SiN_x$ (for example, the $SiN_x$ has a thickness of 70 nm), the reflectivity of the reflective layer 102 will be reduced to 58.02%; and in a case where the protective layer 103 is a single layer of MgO (for example, the MgO has a thickness of 70 nm), the reflectivity of the reflective layer 102 will be reduced to 59%. Such a large reduction of the reflectivity of the reflective layer 102 is obviously contrary to an initial intention of providing the reflective layer 102. Therefore, based on the above findings, the inventors of the present application intends to make the light-emitting panel 10 have a better anti-oxidation effect and/or a moisture isolation effect without reducing the reflectivity of the reflective layer 102 as much as possible.

Figure 4:
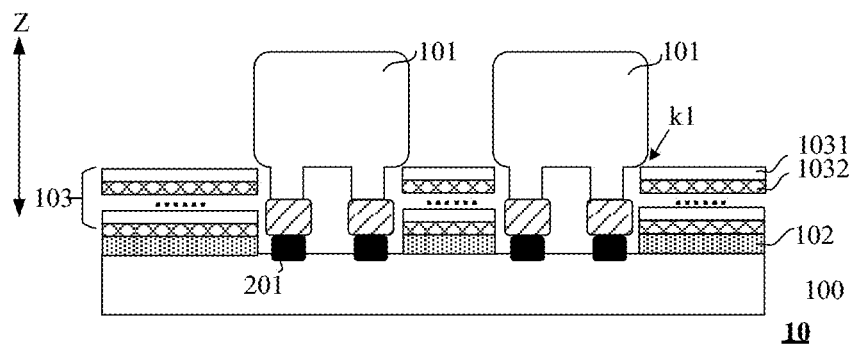
FIG. 4 is another schematic cross-sectional view of the light-emitting panel shown in FIG. 1 along the A-A' direction.

FIG. 4 is another schematic cross-sectional view of the light-emitting panel shown in FIG. 1 along the direction A-A'. As shown in FIG. 4, according to some embodiments of the present application, optionally, the protective layer 103 may include at least one first layer 1031 with a first refractive index and at least one second layer 1032 with a second refractive index in order to make the light-emitting panel 10 have a better anti-oxidation effect and/or a moisture isolation effect on the basis that the reflectivity of the reflective layer 102 is reduced by as little as possible. The first refractive index is different from the second refractive index. Exemplarily, the protective layer 103 may include one first layer 1031 and one second layer 1032, for example, and alternatively, the protective layer 103 may include two first layers 1031 and one second layer 1032, or the protective layer 103 may include two first layers 1031 and two second layers 1032. The number of the first layers 1031 and the number of the second layers 1032 in the protective layer 103 is not limited in the embodiments of the present application.

Taking the protective layer 103 including two first layers 1031 and one second layer 1032 as an example, principles of the embodiments of the present application that the reflectivity of the reflective layer 102 will not be reduced as much as possible will be described below.

Since the refractive index of the first layer 1031 is different from the refractive index of the second layer 1032, i.e., one of the layers has a higher refractive index and the other of the layers has a lower refractive index, the layer with the higher refractive index and the layer with the lower refractive index form an antireflection film (which is a film that ensures the reflectivity of the reflective layer will not be reduced, but transmittance of the reflective layer will be increased), so that the reflectivity of the reflective layer 102 will be reduced slightly or even improved.

For ease of understanding, it is shown in the following expression for a relationship between the reflectivity and the refractive indexes.

$$R = \left[\frac{n_0 - (n_b/n_1)^{2s} n_b^2/n_g}{n_0 + (n_b/n_1)^{2s} n_b^2/n_g}\right]^2 \quad (1)$$

where R represents the reflectivity of the reflective layer 102, $n_0$ represents a refractive index of the air, $n_b$ represents the refractive index of the first layer 1031, $n_1$ represents the refractive index of the second layer 1032, $n_g$ represents a refractive index of the reflective layer 102, and s is a preset coefficient, e.g. s=8.

It is assumed that $n_0=1$, $n_b=2$, $n_1=1.8$, $n_g=1.5$, s=8, which are substituted into the expression (1) to obtain:

$$R = \left[\frac{1 - (2/1.8)^{16} 2^2/1.5}{1 + (2/1.8)^{16} 2^2/1.5}\right]^2 = 75.69\%$$

It can be seen from this that the reflectivity of the reflective layer will be greatly improved, for example, reaching 75.69%, when the antireflection film formed by the layer with a higher refractive index and the layer with a lower refractive index is used compared with when the protective layer 103 includes only the single first layer 1031 or only the single second layer 1032. Moreover, it is general that the larger the $n_b/n_g$ is or the larger the number of layers in the protective layer 103 is, the higher the reflectivity of the reflective layer 102 is.

In this way, since the protective layer 103 includes the first layer 1031 and the second layer 1032 with different refractive indices, the first layer 1031 and the second layer 1032 form an antireflection film, which enables that the light-emitting panel 10 has a better anti-oxidation effect and/or a better moisture isolation effect while keeping the reflectivity of the reflective layer 102 not being reduced as much as possible.

Figure 5:
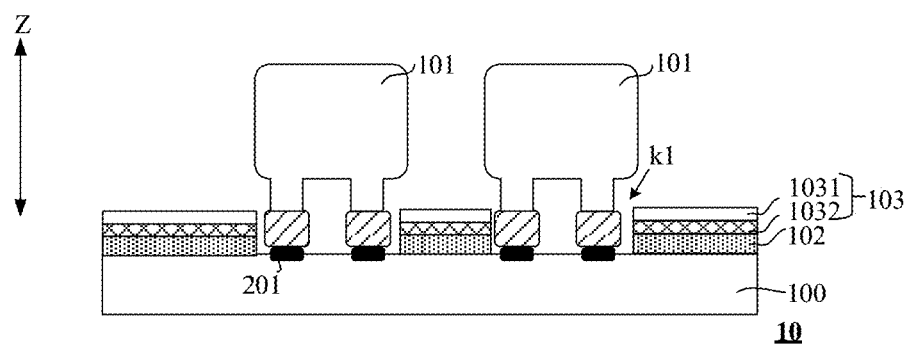
FIG. 5 is another schematic cross-sectional view of the light-emitting panel shown in FIG. 1 along the A-A' direction.

FIG. 5 is another schematic cross-sectional view of the light-emitting panel shown in FIG. 1 along the A-A' direction. As shown in FIG. 5, in some specific embodiments, optionally, the protective layer 103 may include one first layer 1031 and one second layer 1032. In a direction Z perpendicular to a plane where the light-emitting panel 10 is located, the first layer 1031 is disposed at a side of the second layer 1032 that is away from the substrate 100, and the second refractive index is greater than the first refractive index. That is, in the direction Z perpendicular to the plane where the light-emitting panel 10 is located, the layer with a higher refractive index (e.g., the second layer 1032) is closer to the reflective layer 102.

Such settings are based on the inventors' findings that the reflectivity of the reflective layer 102 will be higher when the layer with a higher refractive index (e.g. the second layer 1032) is closer to the reflective layer 102 and the layer with a lower refractive index (e.g. the first layer 1031) is further away from the reflective layer 102 compared with a case where the layer with the lower refractive index (e.g. the first layer 1031) is closer to the reflective layer 102 and the layer with the higher refractive index (e.g. the second layer 1032) is further away from the reflective layer 102. In this way, it can achieve an effect of greatly lowering the reduction of the reflectivity of the reflective layer 102 so as to ensure amounts of light outputted through the protective layer 103 in a case where the protective layer 103 includes only a limited number of the first layers 1031 and the second layers 1032 (i.e., there is a smaller number of the first layers 1031 and the second layers 1032).

It should be noted that, in the embodiment of the present application, it may be that the layer with the lower refractive index (e.g. the first layer 1031) is closer to the reflective layer 102, and the layer with the higher refractive index (e.g. the second layer 1032) is further away from the reflective layer 102, which is not limited in the embodiment of the present application.

Figure 6:
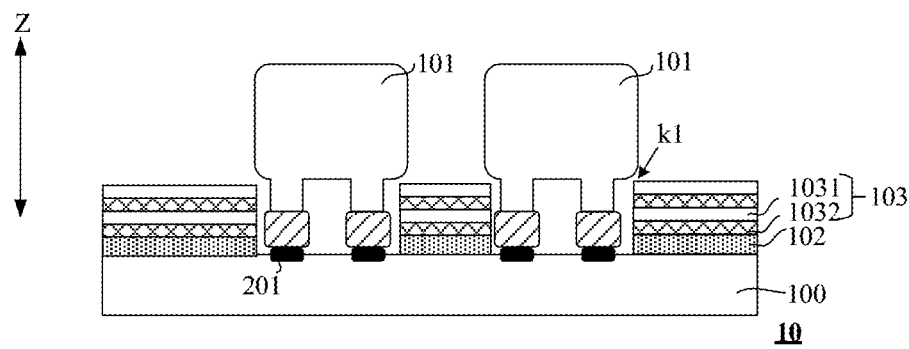
FIG. 6 is another schematic cross-sectional view of the light-emitting panel shown in FIG. 1 along the A-A' direction.

FIG. 6 is another schematic cross-sectional view of the light-emitting panel shown in FIG. 1 along the A-A' direction. As shown in FIG. 6, it differs from the embodiment shown in FIG. 5 that in some other specific embodiments, optionally, the protective layer 103 may include at least two first layers 1031 and at least two second films Layers 1032. In a direction Z perpendicular to the plane where the light-emitting panel 10 is located, the first layers 1031 and the second layers 1032 may be alternately arranged. It should be noted that although FIG. 6 only schematically shows that the protective layer 103 includes two first layers 1031 and two second layers 1032, it should be understood that the protective layer 103 may include more than two first layers 1031 and more than two second layers 1032, which is not limited in the embodiment of the present application.

As mentioned above, it is general that the larger the number of layers in the protective layer 103 is, the higher the reflectivity of the reflective layer 102 is. Therefore, since the protective layer 103 includes a plurality of first layers 1031 and a plurality of second layers 1032, the reflectivity of the reflective layer 102 will be reduced slightly or even will be improved, so that the light-emitting panel 10 has a better anti-oxidation effect and/or a better moisture isolation effect while keeping the reflectivity of the reflective layer 102 not being reduced as much as possible or even improved.

Still referring to FIG. 6, according to some embodiments of the present application, optionally, in the direction Z perpendicular to the plane where the light-emitting panel 10 is located, the layer in the protective layer 103 that is closest to the substrate 100 is the second layer 1032, and the second refractive index is greater than the first refractive index. That is, in the direction Z perpendicular to the plane where the light-emitting panel 10 is located, the layer in the protective layer 103 that is closest to the reflective layer 102 is the second layer 1032 with a higher refractive index.

As mentioned above, the inventors have found from researches that the reflectivity of the reflective layer 102 will be higher when the layer with a higher refractive index (e.g. the second layer 1032) is adjacent to the reflective layer 102 compared with a case where the layer with a lower refractive index (e.g. the first layer 1031) is adjacent to the reflective layer 102. In this way, reduction of the reflectivity of the reflective layer 102 will be further lowered, or even the reflectivity of the reflective layer 102 will be improved.

It should be noted that, in the embodiment of the present application, it may be that the layer with a lower refractive index (e.g. the first layer 1031) is adjacent to the reflective layer 102, which is not limited in the embodiment of the present application.

According to some embodiments of the present application, optionally, each of the first refractive index and the second refractive index may have a value in a range of 1.4 to 2.0.

The reason why each of the refractive indexes according to the embodiments of the present application is set to a value in the above-mentioned range of 1.4 to 2.0 is that the inventors have found that reduction of the reflectivity of the reflective layer 102 will be little or even the reflectivity of the reflective layer 102 will be improved when each of the first refractive index and the second refractive index is set in the range of 1.4 to 2.0. If a wider range is selected for the refractive indices, e.g. when the first refractive index is 1.0 and the second refractive index is 2.5, it is possible to improve the reflectivity of the reflective layer 102, but such improvement is very limited, and when the first refractive index and the second refractive index are outside of the range of 1.4 to 2.0, the anti-oxidation capability and/or the moisture isolation capability of the materials of the first layer 1031 and the second layer 1032 will be greatly reduced such that the light-emitting panel 10 cannot play a better anti-oxidation effect and/or a moisture isolation effect. Therefore, the range of 1.4 to 2.0 for the first refractive index and the second refractive index enables that reduction of the reflectivity of the reflective layer 102 will be little, and thus the light-emitting panel 10 has a better anti-oxidation effect and/or a better moisture isolation effect.

It should be noted that when each of the first refractive index and the second refractive index is set to a value in the range of 1.4 to 2.0, it is necessary to ensure that the first refractive index is different from the second refractive index, for example, it may be that the first refractive index is smaller than the second refractive index. A difference between the first refractive index and the second refractive index may be flexibly adjusted according to an actual situation, which is not limited in the embodiment of the present application.

The inventors of the present application have further found that a change in a thickness of a layer in the protective layer 103 plays a key role in a magnitude of the reflectivity of the reflective layer 102. If the first layer 1031 and the second layer 1032 are simply stacked on the reflective layer 102 without considering the thicknesses of the first layer 1031 and the second layer 1032, the reflectivity of the reflective layer 102 may still be greatly reduced, and thus it is difficult to achieve the effect that reduction of the reflectivity of the reflective layer 102 will be little or even the reflectivity of the reflective layer 102 will be improved. Moreover, if the thickness of the first layer 1031 and of the second layer 1032 is too thin, the first layer 1031 and the second layer 1032 cannot play a better anti-oxidation effect and/or a better moisture isolation effect. If the thickness of the first layer 1031 and of the second layer 1032 is too thick, the reflectivity of the reflective layer 102 may be greatly reduced and production cost will be increased due to excessive waste of materials. Therefore, it is very important for improving the reflectivity of the reflective layer 102 and reducing the production cost to suitably set the thicknesses of the first layer 1031 and of the second layer 1032.

After a large number of experiments and practices by the inventors of the present application, it is finally determined that the thickness of each of the first layers may be set to a value in a range of 25 nm to 100 nm, and/or each of the second layers may be set to a value in a range of 25 nm to 100 nm. It is easy to understand that the thickness refers to a minimum distance (or called as a vertical distance) of a layer in the direction Z perpendicular to the plane where the light-emitting panel is located.

In this way, when the thickness of the first layer and the thickness of the second layer are within the above-mentioned ranges, the first layer 1031 and the second layer 1032 can play a better anti-oxidation effect and/or a better moisture isolation effect, and moreover, reduction of the reflectivity of the reflective layer 102 will be little or even the reflectivity of the reflective layer 102 will be improved, and further materials consumed by the first layer and the second layer can be reduced so as to reduce production cost.

For ease of understanding, an influence of the thickness of a layer in the protective layer 103 on the reflectivity of the reflective layer 102 will be described below with reference to some specific examples.

Figure 7:
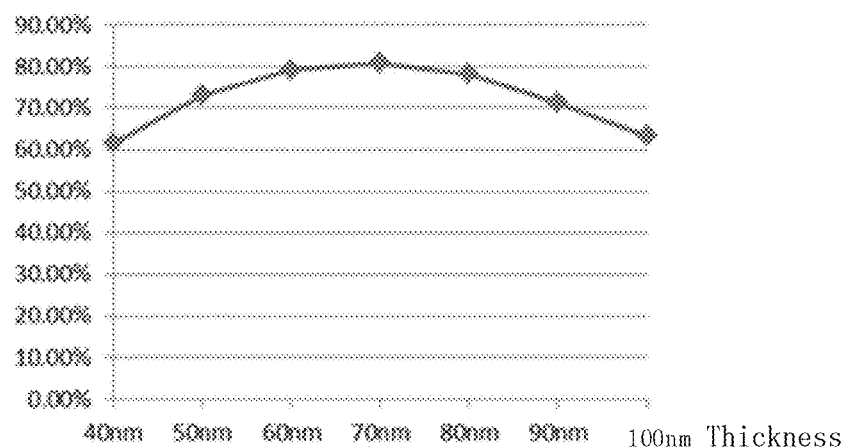
FIG. 7 is a schematic diagram of a relationship between a thickness of a layer in the protective layer and a reflectivity of the reflective layer.

FIG. 7 is a schematic diagram showing a relationship between a thickness of a layer in the protective layer and the reflectivity of the reflective layer. As shown in FIG. 7, a horizontal axis in FIG. 7 represents a thickness of a first layer or a second layer, and a vertical axis in FIG. 7 represents the reflectivity of the reflective layer 102. In a case where the protective layer 103 includes one first layer 1031 (for example, the first layer 1031 has a material of MgO) and one second layer 1032 (for example, the second layer 1032 has a material of $SiN_x$) and both the thickness of the first layer 1031 and the thickness of the second layer 1032 are (approximately) 70 nm, the reflectivity of the reflective layer 102 reaches the maximum, i.e. 80.89%. Compared with the reflectivity of the reflective layer 102 which is 82.52% (obtained by a simulation software) with no protective layer 103, the reflectivity in this case is only reduced by (82.52%. %−80.89%)/82.52%=2.0% than that in the case where the protective layer 103 has not been applied.

Table 1 schematically shows the reflectivity of the reflective layer 102 when the protective layer 103 includes two first layers 1031 (the first layer 1031 has a material of MgO) and two second layers 1032 (the second layer 1032 has a material of $SiN_x$).

TABLE 1

| Thickness of MgO | Thickness of SiNx | | | | | |
|---|---|---|---|---|---|---|
| | 25 nm | 30 nm | 35 nm | 40 nm | 45 nm | 50 nm |
| 25 nm | 74.63% | 78.63% | 81.18% | 82.51% | 82.77% | 81.96% |
| 30 nm | 78.38% | 80.99% | 82.41% | 82.76% | 82.06% | 80.19% |
| 35 nm | 80.85% | 82.32% | 82.74% | 82.15% | 80.41% | 77.37% |
| 40 nm | 82.25% | 82.74% | 82.22% | 80.61% | 77.73% | 73.51% |
| 45 nm | 82.74% | 82.30% | 80.79% | 78.05% | 74.00% | 68.91% |
| 50 nm | 82.37% | 80.95% | 78.34% | 74.47% | 69.52% | 64.00% |

As shown in Table 1, the reflectivity of the reflective layer 102 reaches the maximum, i.e. 82.77% when the thickness of each first layer 1031 is 25 nm and the thickness of each second layer 1032 is 45 nm. Compared with a case where the reflectivity of the reflective layer 102 is 82.52% (obtained by a simulation software) when the protective layer 103 has not been applied, the reflectivity in this case is improved by (82.77%−82.52%)/82.52%=0.3% than that in the case where the protective layer 103 has not been applied. In addition, for the CIE 1931 standard chromaticity in this case, L*=92.91, a*=−2.6758, and b*=5.1351, which meet expected requirements.

It should be noted that data in FIG. 7 and Table 1 above are only schematic, and do not constitute a limitation to the embodiment of the present application.

Still referring to FIG. 5 or FIG. 6, according to some embodiments of the present application, optionally, in the direction Z perpendicular to the plane where the light-emitting panel 10 is located, the layer in the protective layer 103 that is closest to the substrate 100 is the second layer 1032. A moisture absorption capability of a material of the first layer 1031 is greater than a moisture absorption capability of a material of the second layer 1032 and a moisture absorption capability of a material of the reflective layer 102, and/or an anti-oxidation capability of the material of the second layer 1032 is greater than an anti-oxidation capability of the material of the first layer 1031 and an anti-oxidation capability of the material of the reflective layer 102.

That is, the first layer 1031 can be formed of a material having a better moisture absorption capability, and the second layer 1032 may be formed of a material having an anti-oxidation capability. Moreover, in the direction Z perpendicular to the plane where the light-emitting panel 10 is located, the outermost layer (that is farthest away from the substrate 100) in the protective layer 103 is the first layer 1031. In this way, since the first layer 1031 is disposed at the outermost side and the first layer 1031 is formed of a material having a better moisture absorption capability, the first layer 1031 can easily absorb moisture in the air, and thus can play a moisture isolation effect to a larger extent.

According to some embodiments of the present application, optionally, the material of the first layer and/or the material of the second layer may be a transparent material or a translucent material. In other words, an extinction coefficient k (also known as absorbance) of the material of the first layer and/or the material of the second layer may be zero or approximately zero.

In this way, absorption of light by the material of the first layer and/or the material of the second layer can be greatly reduced or even avoided, so that light emitted by the light-emitting elements can pass through the first layer and/or the second layer with almost no loss, thereby further improving the reflectivity of the reflective layer.

In some specific embodiments, optionally, the material of the first layer 1031 may include magnesium oxide or oxynitride, and/or the material of the second layer 1032 may include silicon nitride, aluminum oxide, silica gel, acrylic material, epoxy or oxynitride. That is, the first layer 1031 may be formed of a material having a better moisture absorption capability, and the second layer 1032 may be formed of a material having a better anti-oxidation capability. It should be noted that, in addition to the materials listed above, the first layer 1031 and the second layer 1032 may be formed of other materials having similar material properties, which is not limited in the embodiment of the present application.

Taking an oxynitride (such as silicon oxynitride $SiN_xO_y$) as an example, the oxynitride not only has a better moisture absorption capability, but also has a better anti-oxidation capability. Moreover, by adjusting a ratio of nitrogen N to oxygen O in the oxynitride, the oxynitride will have various refractive indexes, such as varying in a range of 1.4 to 2.0. Therefore, the oxynitride can be used for form the protective layer 103. When forming the protective layer 103, it is possible to form the first layer 1031 and the second layer 1032 with various refractive indexes by adjusting a ratio of nitrogen to oxygen in the oxynitride.

Specifically, in some specific embodiments, optionally, both the material of the first layer 1031 and the material of the second layer 1032 are the oxynitride. Exemplarily, the oxynitride includes silicon oxynitride $SiN_xO_y$. A ratio of nitrogen to oxygen of the material of the first layer 1031 is smaller than a ratio of nitrogen to oxygen of the material of the second layer 1032. It should be noted that it is general that the higher the ratio of nitrogen to oxygen in the oxynitride (i.e., a percentage of nitrogen), the higher the refractive index is. Therefore, for the case where the ratio of nitrogen to oxygen of the material of the first layer 1031 is smaller than the ratio of nitrogen to oxygen of the material of the second layer 1032, it can be understood as that the refractive index of the material of the first layer 1031 is smaller than the refractive index of the material of the second layer 1032. For example, in some examples, the material of the first layer 1031 may include $SiO_{0.6}N_{0.4}$, and the material of the second layer 1032 may include $SiO_{0.2}N_{0.8}$.

In this way, since both the first layer 1031 and the second layer 1032 in the protective layer 103 are formed of oxynitride (such as the silicon oxynitride $SiN_xO_y$), it is possible to provide the first layer 1031 and the second layer 1032 that have different refractive indexes when forming the protective layer 103 by merely adjusting a ratio of nitrogen to oxygen (for example, adjusting an intake ratio of nitrogen gas and oxygen gas). That is, only one process is needed to form the protective layer 103 including layers with different refractive indexes, which is beneficial to simplification of processes. In addition, since oxynitride for forming the first layer 1031 and oxynitride for forming the second layer 1032 both have a better moisture absorption capability and a better anti-oxidation capability, the moisture absorption capability and anti-oxidation capability of the protective layer 103 can be further improved.

For ease of understanding, following description are made with reference to some specific examples.

Table 2 schematically shows the reflectivity of the reflective layer 102 when the protective layer 103 includes two first layers 1031 (the first layer 1031 has a material of $SiO_{0.6}N_{0.4}$) and two second layers 1032 (the second layer 1032 has a material of $SiO_{0.2}N_{0.8}$).

TABLE 2

| Thickness of $SiO_{0.6}N_{0.4}$ | Thickness of $SiO_{0.2}N_{0.8}$ | | | | | |
|---|---|---|---|---|---|---|
| | 25 nm | 30 nm | 35 nm | 40 nm | 45 nm | 50 nm |
| 25 nm | 71.92% | 76.08% | 79.19% | 81.26% | 82.4% | 82.71% |
| 30 nm | 75.92% | 79.04% | 81.15% | 82.34% | 82.69% | 82.24% |
| 35 nm | 78.92% | 81.05% | 82.28% | 82.68% | 82.28% | 81.02% |
| 40 nm | 80.98% | 82.23% | 82.67% | 82.32% | 81.12% | 79% |
| 45 nm | 82.2% | 82.67% | 82.35% | 81.22% | 79.18% | 76.2% |
| 50 nm | 82.67% | 82.39% | 81.3% | 79.33% | 76.44% | 72.76% |

As shown in Table 2, the reflectivity of the reflective layer 102 reaches the maximum, i.e. 82.71% when each first layer 1031 has a thickness of 25 nm and each second layer 1032 has a thickness of 50 nm. Compared with a case where the reflectivity of the reflective layer 102 is 82.52% (obtained by a simulation software) when the protective layer 103 has not been applied, the reflectivity in this case is improved by (82.71%−82.52%)/82.52%=0.23% than that in the case where the protective layer 103 has not been applied.

Figure 8:
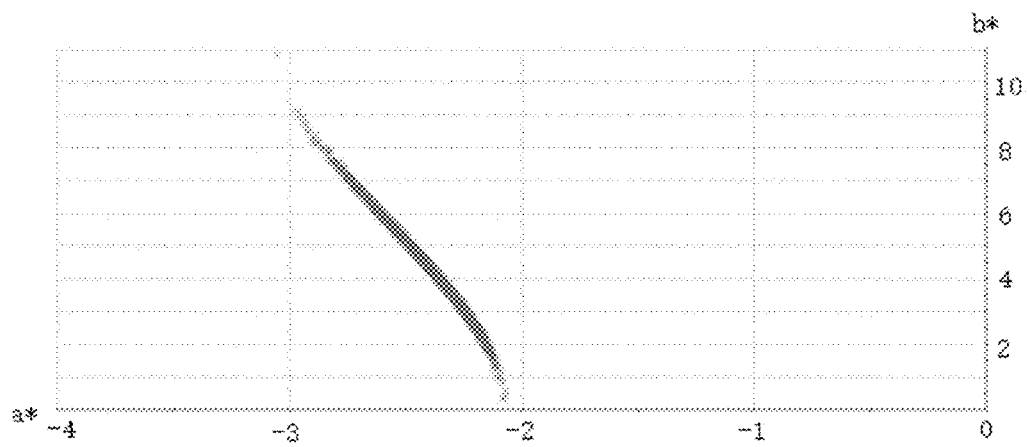
FIG. 8 is a schematic diagram of hues of a CIE 1931 standard chromaticity system according to an embodiment of the present application.

FIG. 8 is a schematic diagram of hues of a CIE 1931 standard chromaticity system according to an embodiment of the application. As shown in FIG. 8, a horizontal axis of FIG. 8 represents an a* color channel in the CIE 1931 standard chromaticity system, and a vertical axis of FIG. 8 represents a b* color channel in the CIE 1931 standard chromaticity system. As shown in FIG. 8, the b* varies in a range from 0 to 9 and the a* varies in a range from −2 to −3 when the protective layer 103 includes two first layers 1031 (the first layer 1031 has a material of $SiO_{0.6}N_{0.4}$) and two second layers 1032 (the second layer 1032 has a material of $SiO_{0.2}N_{0.8}$), which meets expected requirements.

Figure 9:
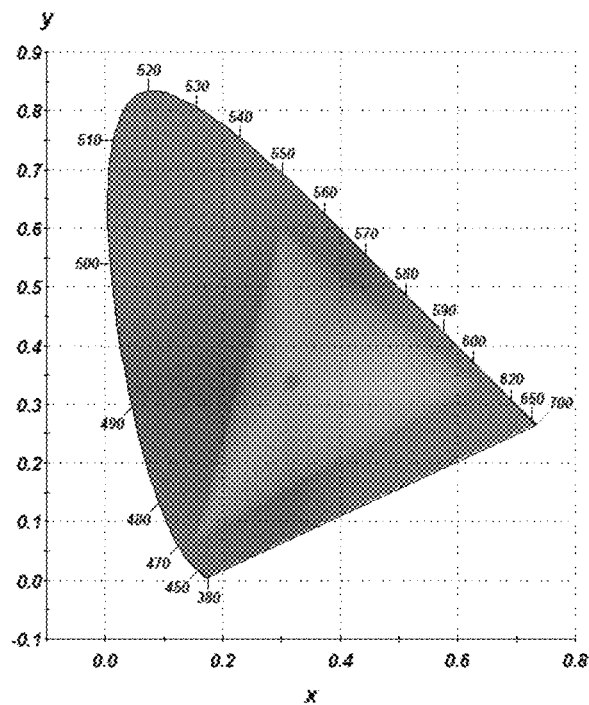
FIG. 9 is a schematic diagram of a color gamut of the CIE 1931 standard chromaticity system according to an embodiment of the present application.

FIG. 9 is a schematic diagram of a color gamut of the CIE 1931 standard chromaticity system according to an embodiment of the present application. As shown in FIG. 9, a horizontal axis of FIG. 9 represents coordinates of a color x in the CIE 1931 standard chromaticity system, and a vertical axis of FIG. 9 represents coordinates of a color y in the CIE 1931 standard chromaticity system. As shown in FIG. 9, when the protective layer 103 includes two first layers 1031 (the first layer 1031 has a material of $SiO_{0.6}N_{0.4}$) and two second layers 1032 (the second layer 1032 has a material of $SiO_{0.2}N_{0.8}$), there is a small fluctuation in the color gamut, that is, a coordinate of a white color at center merely fluctuates in a small range, which meets expected requirements.

Figure 10:
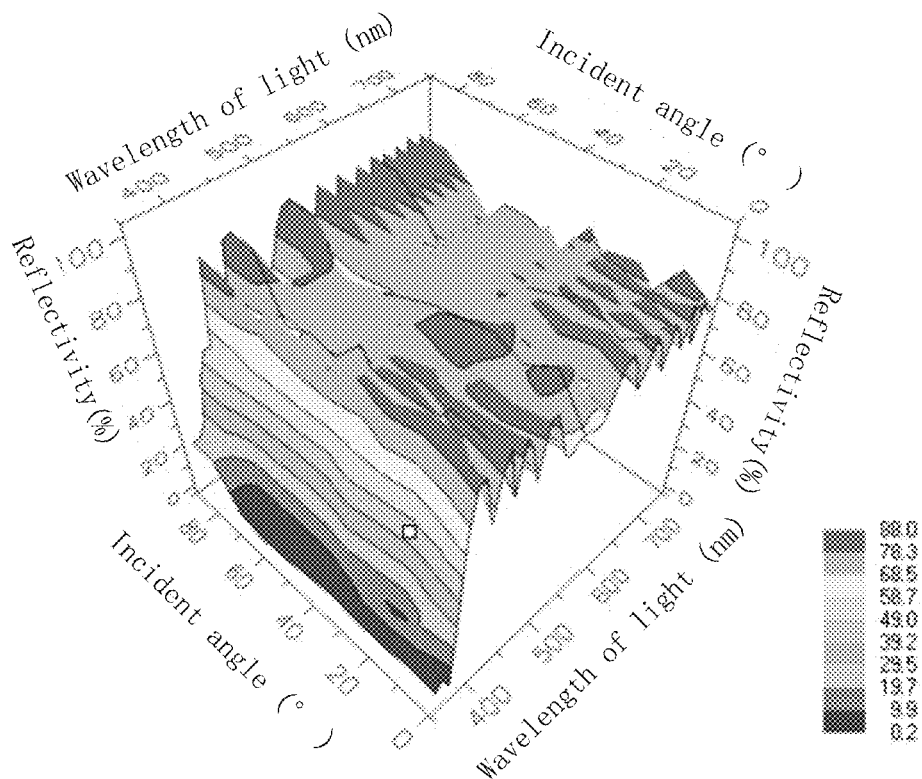
FIG. 10 is a schematic diagram of a relationship between wavelengths of light, incident angles and the reflectivity of the reflective layer according to an embodiment of the present application.

FIG. 10 is a schematic diagram of a relationship between wavelengths of light, incident angles and the reflectivity of the reflective layer according to an embodiment of the present application. An X-axis in FIG. 10 represents wavelengths in nm; a Y-axis in FIG. 10 represents incident angles; and a Z-axis in FIG. 10 represents the reflectivity. As shown in FIG. 10, in a case where the protective layer 103 includes two first layers 1031 (the first layer 1031 has a material of $SiO_{0.6}N_{0.4}$) and two second layers 1032 (the second layer 1032 has a material of $SiO_{0.2}N_{0.8}$), if the wavelength is within a range of 400 nm to 700 nm, the reflectivity corresponding to each of different incident angles reaches more than 70%, which is a higher reflectivity.

The inventors of the present application have further found that process requirements for the reflective layer 102 are that it has a uniform thickness and has no defects such as air bubbles and perforations, but the reflective layer 102 practically has a surface roughness in an order of μm. In this way, since the reflective layer 102 has a larger surface roughness, it is not conducive to realization of surface coating.

Figure 11:
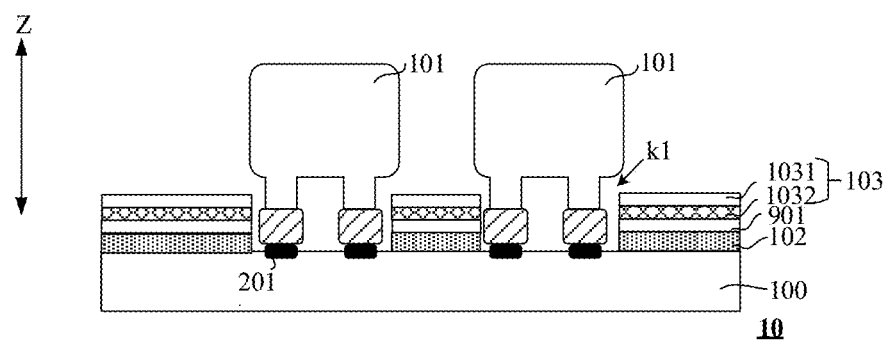
FIG. 11 is another schematic cross-sectional view of the light-emitting panel shown in FIG. 1 along the A-A' direction.

In view of this, the inventors of the present application anticipate that before the protective layer 103 is formed, a planarization layer is formed on the reflective layer 102 to facilitate forming of the protective layer 103. FIG. 11 is another schematic cross-sectional view of the light-emitting panel shown in FIG. 1 along the A-A' direction. Specifically, as shown in FIG. 11, according to some embodiments of the present application, optionally, the light-emitting panel 10 may further include a planarization layer 901, and in a direction Z perpendicular to the plane where the light-emitting panel 10 is located, the planarization layer 901 may be located between the protective layer 103 and the reflective layer 102. Exemplarily, the planarization layer 901 may include, but is not limited to, OC optical cement.

In this way, by providing the planarization layer 901 between the protective layer 103 and the reflective layer 102, coating of the protective layer 103 can be facilitated, and the protective layer 103 can be prevented from peeling off easily.

According to some embodiments of the present application, optionally, in the direction Z perpendicular to the plane where the light-emitting panel is located, the planarization layer 901 may have a thickness in a range of 5 μm to 20 μm.

The reason why the thickness of the planarizing layer 901 in the embodiment of the present application is set to a value in the range of 5 μm to 20 μm is that the inventors have found that when the thickness of the planarizing layer 901 is less than 5 μm, a surface of the planarizing layer 901 that is facing away from the reflective layer 102 is still not flat enough, which is not conducive to coating of the protective layer 103; and when the thickness of the planarization layer 901 is greater than 20 μm, the reflectivity of the reflective layer 102 may be reduced due to too thick thickness of the planarization layer 901 and production cost will be increased. Therefore, setting the thickness of the planarization layer 901 to be a value in the range of 5 μm to 20 μm not only facilitates coating of the protective layer 103 but also ensures that the reflective layer 102 has a higher reflectivity and maintains a reduced production cost.

In some specific examples, the thickness of the planarization layer 901 is, for example, 10 μm. For ease of understanding, detailed descriptions are given below with reference to some specific examples.

Table 3 schematically shows that the reflectivity of the reflective layer 102 when the thickness of the planarization layer 901 is 10 μm and the protective layer 103 includes two first layers 1031 (the first layer 1031 has a material of MgO) and two second layers 1032 (the first layer 1032 has a material of $SiN_x$).

As shown in Table 3, in a case where the planarization layer 901 with a thickness of 10 μm is provided and the thickness of each first layer 1031 is 45 nm and the thickness of each second layer 1032 is 45 nm, the reflectivity of the reflective layer 102 reaches the maximum, i.e. 80.84%. Compared with a case where the reflectivity of the reflective layer 102 is 82.52% (obtained by a simulation software) when the protective layer 103 has not been applied, the reflectivity in this case is decreased only by (82.52%−80.84%)/82.52%=2.0% than that when the protective layer 103 has not been applied. In addition, for the CIE 1931 standard chromaticity, L*=89.95, a*=−0.2320, b*=0.0282 in this case, which meets expected requirements.

Table 4 schematically shows the reflectivity of the reflective layer 102 when the thickness of the planarization layer 901 is 10 μm and the protective layer 103 includes two first layers 1031 (the first layer has a material of $SiO_{0.6}N_{0.4}$) and two second layers 1032 (the second layer 1032 has a material of $SiO_{0.2}N_{0.8}$).

TABLE 4

| Thickness of $SiO_{0.6}N_{0.4}$ | Thickness of $SiO_{0.2}N_{0.8}$ | | | | | |
|---|---|---|---|---|---|---|
| | 25 nm | 30 nm | 35 nm | 40 nm | 45 nm | 50 nm |
| 25 nm | 71.67% | 70.35% | 69.88% | 70.74% | 72.82% | 75.35% |
| 30 nm | 70.45% | 69.95% | 70.74% | 72.76% | 75.26% | 77.5% |
| 35 nm | 70% | 70.75% | 72.7% | 75.17% | 77.42% | 79.1% |
| 40 nm | 70.75% | 72.65% | 75.09% | 77.33% | 79.03% | 80.08% |
| 45 nm | 72.6% | 75.01% | 77.25% | 78.96% | 80.04% | 80.43% |
| 50 nm | 74.93% | 77.16% | 78.89% | 79.98% | 80.41% | 80.27% |

As shown in Table 4, in a case where the planarization layer 901 with a thickness of 10 μm is provided and the thickness of each first layer 1031 is 45 nm and the thickness of each second layer 1032 is 50 nm, the reflectivity of the reflective layer 102 reaches the maximum, i.e. 80.43%. Compared with a case where the reflectivity of the reflective layer 102 is 82.52% (obtained by a simulation software) when the protective layer 103 has not been applied, the reflectivity in this case is decreased only by (82.52%−80.43%)/82.52%=2.53% than that when the protective layer 103 has not been applied.

Figure 12:
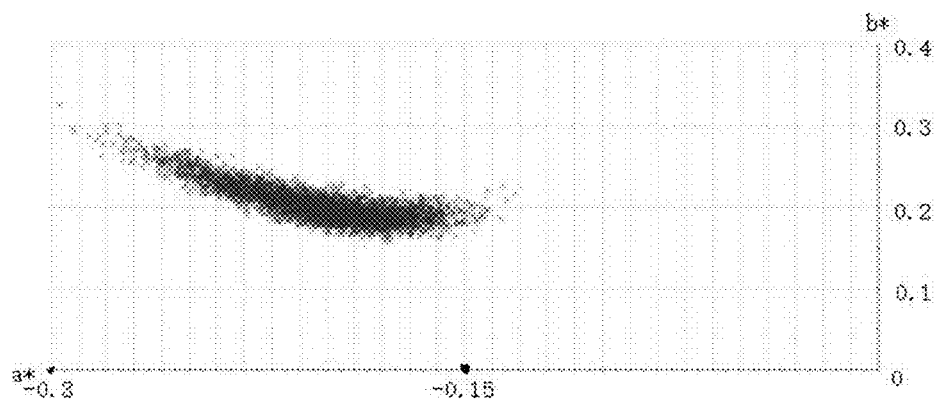
FIG. 12 is another schematic diagram of hues of the CIE 1931 standard chromaticity system according to an embodiment of the present application.

FIG. 12 is another schematic diagram of hues of the CIE 1931 standard chromaticity system according to an embodiment of the application. A horizontal axis of FIG. 12 represents an a* color channel in the CIE 1931 standard chromaticity system, and a vertical axis of FIG. 12 represents a b* color channel in the CIE 1931 standard chromaticity system. As shown in FIG. 8 and FIG. 12, after the planarization layer 901 is provided, a range of variation of b* and a range of variation of a* in FIG. 12 are obviously

TABLE 3

| Thickness of MgO | Thickness of SiNx | | | | | | | |
|---|---|---|---|---|---|---|---|---|
| | 25 nm | 30 nm | 35 nm | 40 nm | 45 nm | 50 nm | 55 nm | 60 nm |
| 25 nm | 70.35% | 69.13% | 69.52% | 71.85% | 75.05% | 77.86% | 79.81% | 80.74% |
| 30 nm | 69.25% | 69.54% | 71.74% | 74.88% | 77.70% | 79.70% | 80.71% | 80.80% |
| 35 nm | 69.56% | 71.64% | 74.71% | 77.54% | 79.58% | 80.67% | 80.83% | 80.41% |
| 40 nm | 71.55% | 74.56% | 77.39% | 79.46% | 80.61% | 80.84% | 80.47% | 79.74% |
| 45 nm | 74.41% | 77.23% | 79.33% | 80.54% | 80.84% | 80.50% | 79.81% | 78.78% |
| 50 nm | 77.08% | 79.20% | 80.45% | 80.81% | 80.52% | 79.86% | 78.86% | 77.55% | reduced compared with that in FIG. 8, wherein the b* varies merely in a range from 0.15 to 0.3, the a* varies merely in a range from −0.15 to −0.3.

Figure 13:
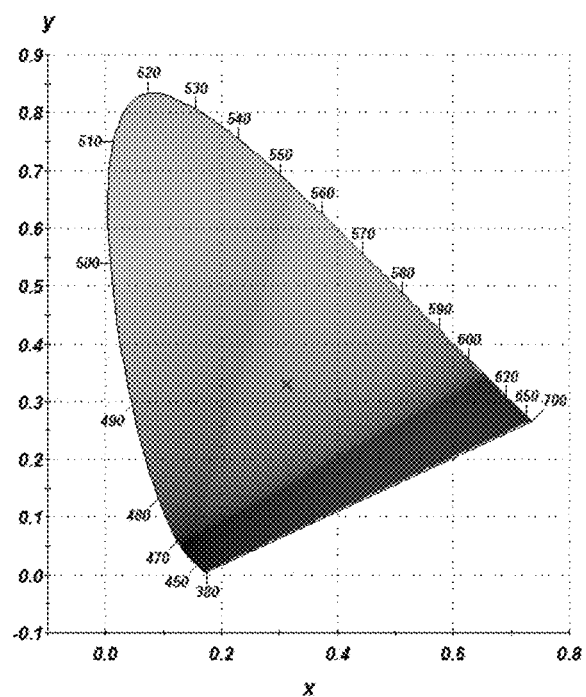
FIG. 13 is another schematic diagram of a color gamut of the CIE 1931 standard chromaticity system according to an embodiment of the present application.

FIG. 13 is another schematic diagram of a color gamut of the CIE 1931 standard chromaticity system according to an embodiment of the application. A horizontal axis of FIG. 13 represents coordinates of a color x in the CIE 1931 standard chromaticity system, and a vertical axis of FIG. 13 represents coordinates of a color y in the CIE 1931 standard chromaticity system. As shown in FIGS. 9 and 13, after the planarization layer 901 is provided, fluctuation of the color gamut in FIG. 13 becomes smaller compared with that in FIG. 9, wherein the coordinate of the white color at center fluctuate in a smaller range, and the fluctuation of the color gamut become more stable.

Figure 14:
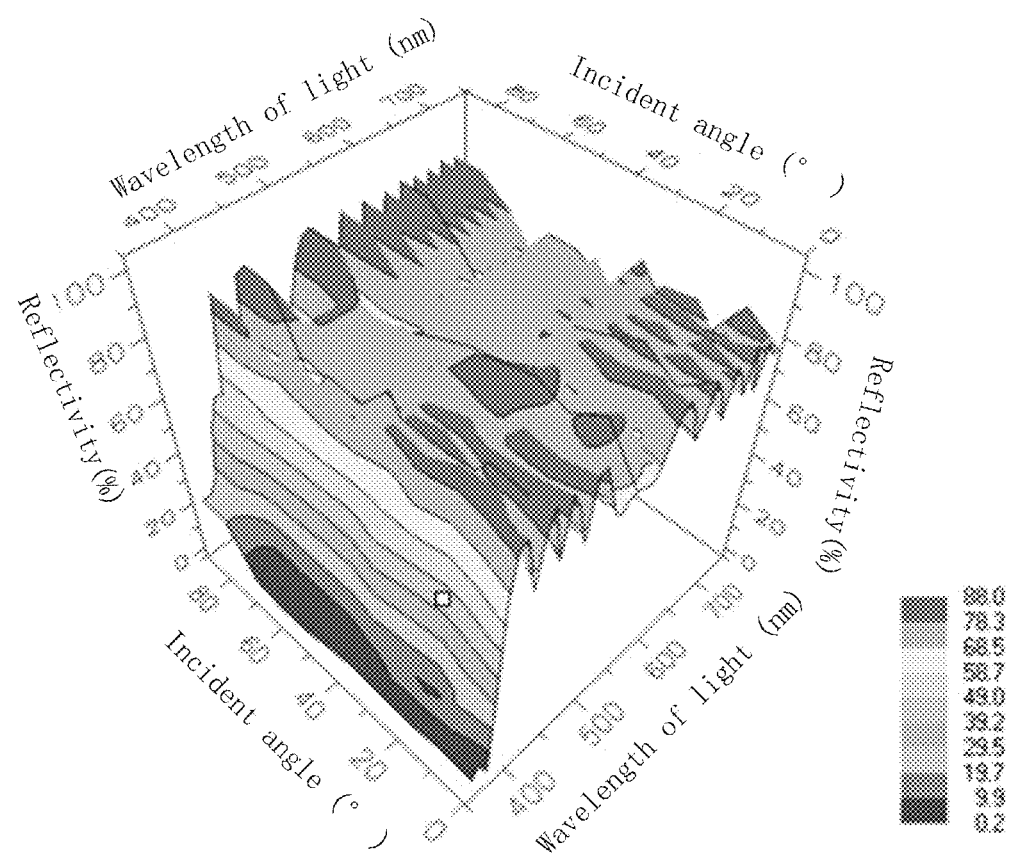
FIG. 14 is another schematic diagram of a relationship between wavelengths of light, incident angles and the reflectivity of the reflective layer according to an embodiment of the present application.

FIG. 14 is a schematic diagram showing another relationship between wavelengths of light, incident angles and the reflectivity of the reflective layer according to an embodiment of the present application. An X-axis in FIG. 14 represents wavelengths in nm; a Y-axis in FIG. 14 represents incident angles; and a Z-axis in FIG. 14 represents the reflectivity. As shown in FIG. 14, after the planarization layer 901 is provided and in a case where the protective layer 103 includes two first layers 1031 (the first layer 1031 has a material of $SiO_{0.6}N_{0.4}$) and two second layers 1032 (the second layer 1032 has a material of $SiO_{0.2}N_{0.8}$), if the wavelength is within a range of 400 nm to 700 nm, the reflectivity corresponding to each of different incident angles reaches more than 70%, which is a higher reflectivity.

It should be noted that data in the above-mentioned FIGS. 8 to 14 and Tables 2 to 4 are only schematic, and do not constitute limitations to the embodiments of the present application.

According to some embodiments of the present application, optionally, a material of the planarization layer may be a transparent material or a translucent material. In other words, an extinction coefficient k (also known as absorbance) of the material of the planarization layer may be zero or approximately zero.

In this way, absorption of light by the material of the planarization layer can be greatly reduced or even avoided, so that light emitted by the light-emitting elements can pass through the planarization layer with almost no loss, thereby further improving the reflectivity of the reflective layer.

Figure 15:
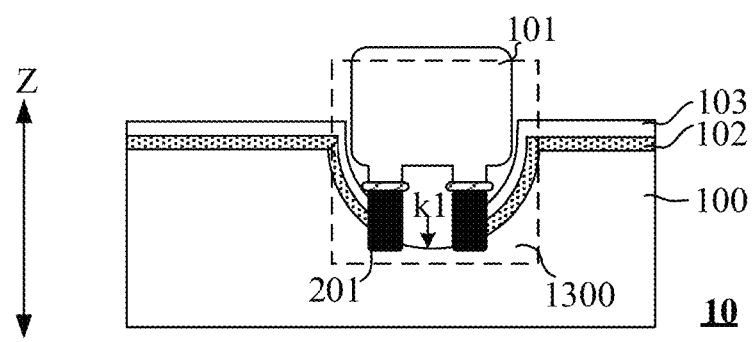
FIG. 15 is a schematic cross-sectional view of a light-emitting panel according to an embodiment of the present application.

FIG. 15 is a schematic cross-sectional view of a light-emitting panel according to an embodiment of the present application. As shown in FIG. 15, according to some embodiments of the present application, optionally, the substrate 100 may be provided with a plurality of light-condensing grooves 1300 in order to improve an efficiency of light outputting of the light-emitting panel 10. In a direction Z perpendicular to a plane where the light emitting panel 10 is located, the light-condensing grooves 1300 are at least overlapped with the openings k1. The reflective layer 102 and protective layer 103 are stacked and disposed on surfaces of the light-condensing grooves 1300, and the bonding points 201 may be disposed within the light-condensing grooves 1300. It should be noted that a shape and size of the light-condensing groove 1300 may be flexibly adjusted according to an actual situation, which is not limited in the embodiment of the present application. Exemplarily, the light-condensing groove 1300 may be a curved groove, for example.

In this way, by providing the light-condensing grooves 1300, the light emitted by the light-emitting elements 101 can be condensed and then reflected, which increases a divergence angle of the light emitted by the light-emitting elements 101 and thereby improves a luminous effect of the light-emitting panel.

Figure 16:
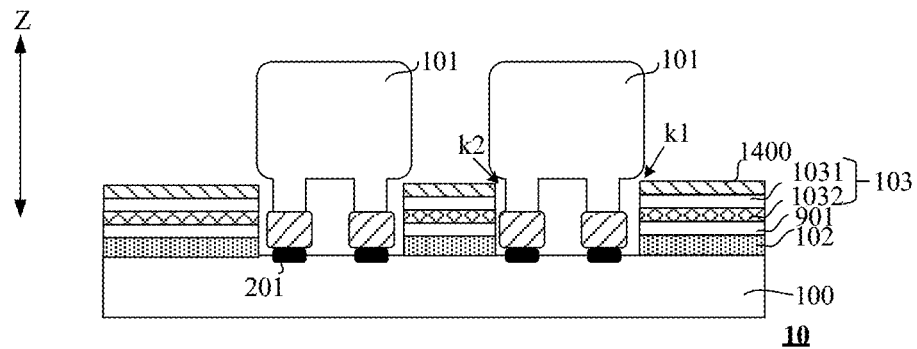
FIG. 16 is another schematic cross-sectional view of the light-emitting panel shown in FIG. 1 along the A-A' direction.

FIG. 16 is another schematic cross-sectional view of the light-emitting panel shown in FIG. 1 along the A-A' direction. As shown in FIG. 16, according to some embodiments of the present application, optionally, the light-emitting panel 10 may further include a sealing layer 1400 in order to avoid invalidation of the protective layer 103 due to damages, and in a direction Z perpendicular to the plane where the light-emitting panel is located, the sealing layer 1400 is disposed at a side of the protective layer 103 that is away from the substrate 100. It is easy to understand that the sealing layer 1400 is provided with openings k2, and in the direction Z perpendicular to the plane where the light-emitting panel is located, the openings k2 of the sealing layer 1400 are at least overlapped with the openings k1 of the protective layer 103 and the reflective layer 102 so as to expose the bonding points 201. Exemplarily, a material of the sealing layer 1400 may include, but is not limited to, epoxy resin, silica gel or any other material with a higher light transmittance.

In this way, by providing the sealing layer 1400 at the side of the protective layer 103 that is away from the substrate 100, the protective layer 103 can be well protected and prevented from being scratched, thereby preventing invalidation of the protective layer 103 due to damages.

On the basis of the light-emitting panel according to the above-mentioned embodiments, the present application also provides a method for fabricating a light-emitting panel, and the method for fabricating a light-emitting panel can be used to fabricate the light-emitting panel 10 according to the above-mentioned embodiments, for example.

Figure 17:
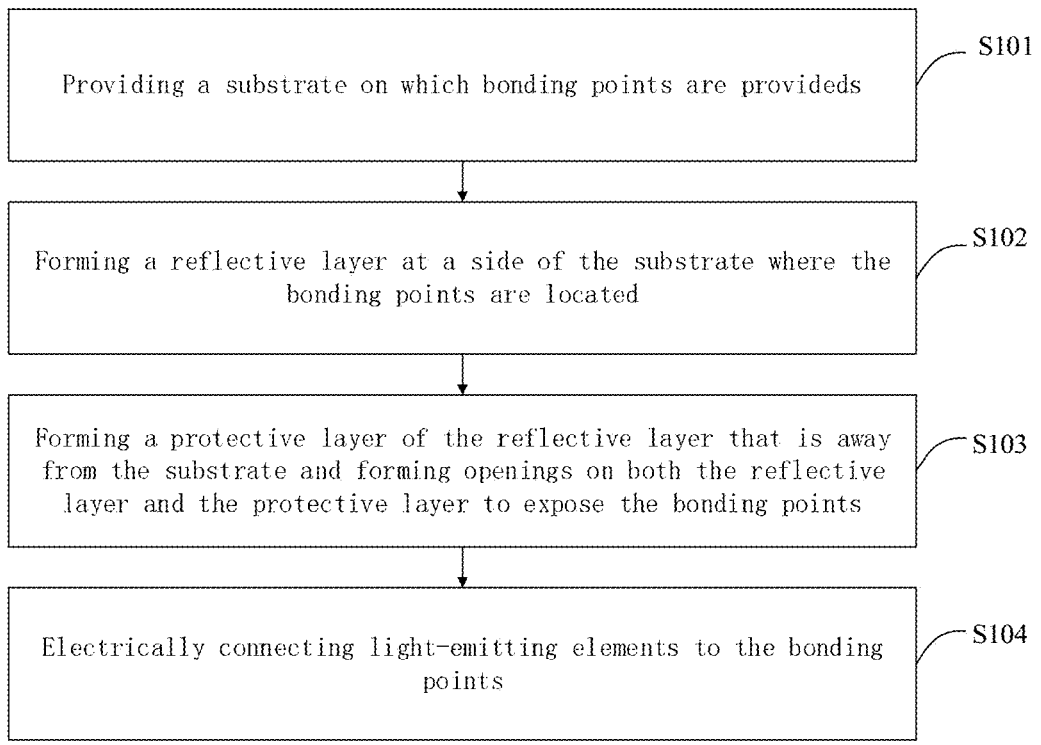
FIG. 17 is a schematic flowchart of a method for fabricating a light-emitting panel according to an embodiment of the present application.

FIG. 17 is a schematic flowchart of a method for fabricating a light-emitting panel according to an embodiment of the present application. As shown in FIG. 17, the method for fabricating a light-emitting panel according to an embodiment of the present application includes following steps S101 to S104.

At S101, a substrate is provided, wherein the substrate is provided with bonding points.

Figure 18:
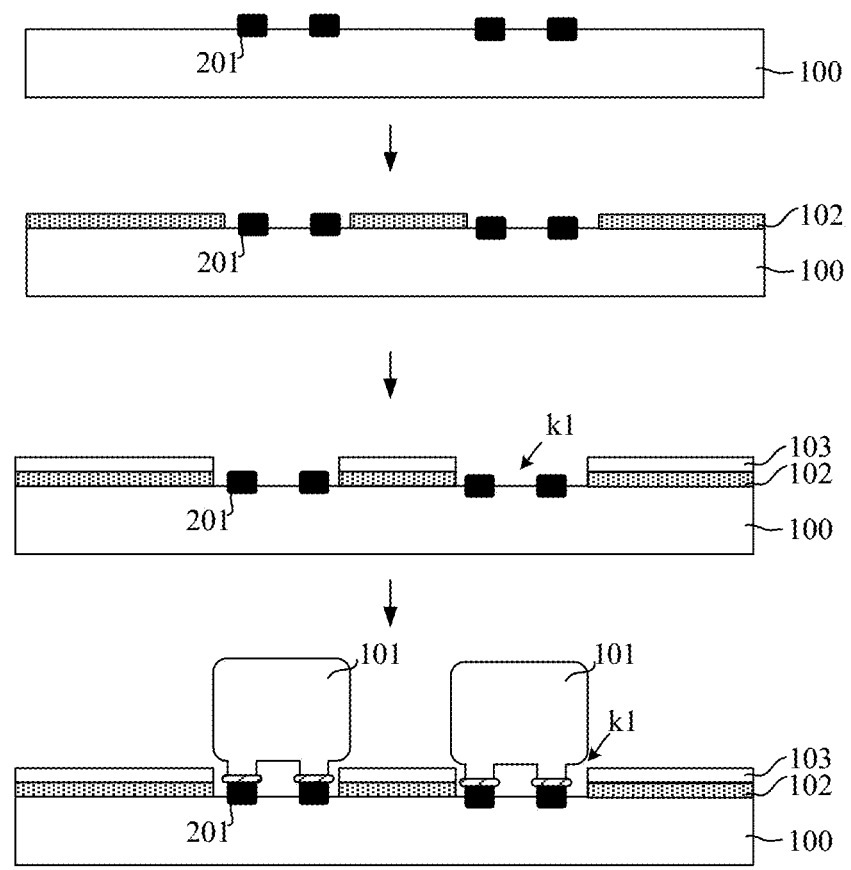
FIG. 18 is a schematic process diagram of a method for fabricating a light-emitting panel according to an embodiment of the present application.

FIG. 18 is a process schematic diagram of a method for fabricating a light-emitting panel according to an embodiment of the present application. Referring to FIG. 18, at S101, a substrate 100 is provided, wherein the substrate 100 is provided with bonding points 201. The substrate 100 may include, but is not limited to, a rigid substrate, and the rigid substrate may include, but is not limited to, a glass substrate, a printed circuit board (Printed Circuit Board, PCB) substrate, or any other rigid substrate.

At S102, a reflective layer is formed at a side of the substrate where the bonding points are located.

Referring to FIG. 18, at S102, a reflective layer 102 may be formed by spraying on the side of the substrate 100 where the bonding points 201 are disposed. The reflective layer 102 may include, but is not limited to, white reflective ink (referred as white ink for short), and the reflective layer 102 may be formed of any other material having a higher reflectivity in addition to the white reflective ink, which is not limited in the embodiment of the present application.

At S103, a protective layer is formed at a side of the reflective layer that is away from the substrate, and openings are formed on both the protective layer and the reflective layer to expose the bonding points.

Referring to FIG. 18, at S103, a protective layer 103 may be formed at a side of the reflective layer 102 that is away from the substrate 100, and openings k1 may be formed on the protective layer 103 and the reflective layer 102 through a patterning process to expose the bonding points 201. It should be noted that the openings on the reflective layer 102 may be provided by a patterning process before forming of the protective layer, as long as it is ensured that the openings on the protective layer 103 are overlapped with the openings on the reflective layer 102 in the direction perpendicular to the plane where the light-emitting panel is located.

At S104, light-emitting elements are electrically connected to the bonding points.

Referring to FIG. 18, at S104, light-emitting elements 101 may be electrically connected by welding or any other bonding method (e.g., conductive adhesive bonding) to the bonding points 201, for example.

In the method for fabricating a light-emitting panel according to an embodiment of the present application, by providing the protective layer 103 at the side of the reflective layer 102 that is away from the substrate 100, the protective layer 103 can play an anti-oxidation effect, and thus oxidation of the reflective layer 102 during a bonding process of the light-emitting elements 101 or a light-emitting process of the light-emitting elements 101 can be reduced or even avoided, thereby reducing or even avoiding yellowing of the reflective layer 102, and thus a light-outputting effect of the light-emitting panel 10 can be improved, and/or the protective layer 103 can play a moisture isolation effect to prevent intrusion of moisture as much as possible, thereby reducing or even avoiding corrosion of wirings or electronic devices in the light-emitting elements 101 and in the substrate 100.

Figure 19:
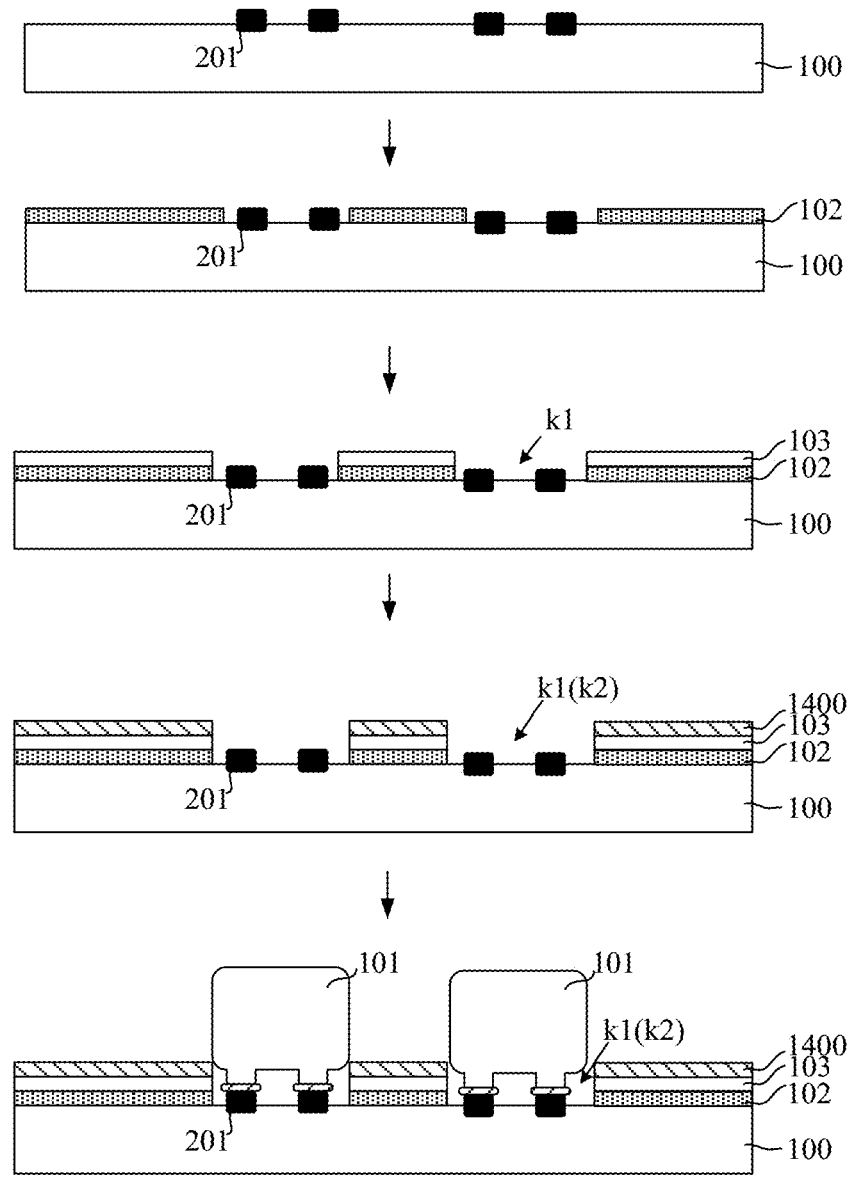
FIG. 19 is another schematic process diagram of a method for fabricating a light-emitting panel according to an embodiment of the present application.

FIG. 19 is another process schematic diagram of a method for fabricating a light-emitting panel according to an embodiment of the present application. As shown in FIG. 19, in some embodiments, before the light-emitting elements are electrically connected to the bonding points at S104, the method for fabricating the light-emitting panel may further include the following steps: forming a sealing layer 1400 at a side of the protective layer 103 that is away from the substrate 100, and forming openings k2 on the sealing layer 1400, wherein the openings k2 on the sealing layer 1400 are at least overlapped with the openings k1 on the protective layer 103 and the reflective layer 102 to expose the bonding points 201. Exemplarily, the sealing layer 1400 has a material which may include, but is not limited to, epoxy resin, silica gel or any other material having a higher light transmittance.

In this way, by providing the sealing layer 1400 at the side of the protective layer 103 that is away from the substrate 100, the protective layer 103 can be well protected and prevented from being scratched, thereby preventing invalidation of the protective layer 103 due to damages.

In some embodiments, after the reflective layer is formed at the side of the substrate where the bonding points are disposed at S102 but before the protective layer is formed at the side of the reflective layer that is away from the substrate at S103, the method for fabricating the light-emitting panel may further include the following step: forming a planarization layer 901 at a side of the reflective layer 102 that is away from the substrate 100, as shown in FIG. 11. The planarization layer 901 is provided with openings. In a direction Z perpendicular to a plane where the light-emitting panel is located, the openings on the planarization layer 901 are at least overlapped with the openings k1 on the protective layer 103 and the reflective layer 102 to expose the bonding points 201. Exemplarity, the planarization layer 901 may include, but is not limited to, OC optical adhesive.

In this way, by providing the planarization layer 901 between the protective layer 103 and the reflective layer 102, it can facilitate coating of the protective layer 103 and prevent the protective layer 103 from falling off easily.

In some embodiments, before S101, the method for fabricating the light-emitting panel may further include the following steps: providing a plurality of light-condensing grooves 1300 on the substrate 100, as shown in FIG. 15, and forming the bonding points 201 within the light-condensing grooves 1300. It should be noted that a shape and size of the light-condensing groove 1300 may be flexibly adjusted according to an actual situation, which is not limited in the embodiment of the present application.

In this way, by providing the light-condensing grooves 1300, the light emitted by the light-emitting elements 101 can be condensed and then reflected, which increases a divergence angle of the light emitted by the light-emitting elements 101 and thereby improves a luminous effect of the light-emitting panel.

In some embodiments, the protective layer 103 may include a first layer 1031 and a second layer 1032 that have different refractive indices. The S103 may specifically include: sequentially forming stacked second layer 1032 and first layer 1031 at a side of the reflective layer 102 that is away from the substrate 100, and providing openings k1 on the first layer 1031, the second layer 1032 and the reflective layer 102 to expose the bonding points 201.

It should be noted that the method for fabricating the light-emitting panel in the above method embodiments attains technical effects corresponding to that of the light-emitting panel 10 in the above product embodiments, which are not repeated here for sake of brevity.

Figure 20:
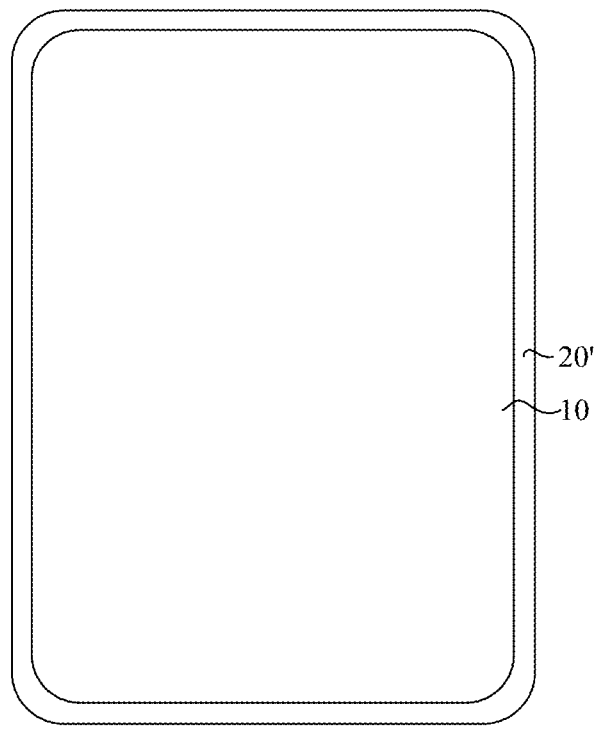
FIG. 20 is a schematic top view of a display device according to an embodiment of the present application.

On the basis of the light-emitting panel according to the above embodiments, the present application also provides a display device accordingly. As shown in FIG. 20, the display device 1000 may include a device body 20' and the light-emitting panel 10 in the above-mentioned embodiments, wherein the light-emitting panel 10 is overlaid on the device body 20'. In the device body 20', there may be provided various types of devices, such as sensors, processors, etc., which are not limited herein. The display device 1000 may specifically be a device having a display function, such as a mobile phone, a computer, a tablet computer, a digital camera, a television, and an electronic paper, which is not limited herein.

Figure 21:
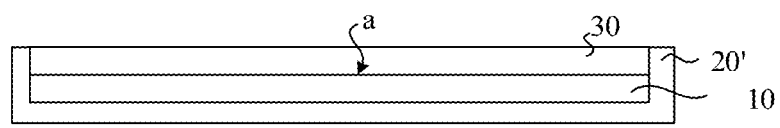
FIG. 21 is a schematic cross-sectional view of a display device according to an embodiment of the present application.

As shown in FIG. 21, in some embodiments, the light-emitting panel 10 may be a backlight panel, and the display device 1000 may further include a display panel 30 at a side of a light-emitting surface of the backlight panel (as shown by the surface a in FIG. 21).

It should be clear that the embodiments in the specification are described in a progressive manner, and same or similar parts of respective embodiments can be referred to each other, and each embodiment focuses on differences from other embodiments. For the embodiments of the display panel and the embodiments of the display device, references may be made to those descriptions of the embodiments of the pixel driving circuit and the embodiments of the array substrate. The present application is not limited to the specific structures described above and shown in the drawings. Various changes, modifications and additions can be made by a person skilled in the art after comprehending spirits of the present application. Also, for sake of brevity, detailed descriptions of known technologies are omitted here.

It should be understood for a person skilled in the art that the above-mentioned embodiments are all illustrative and not restrictive. Different technical features appearing in different embodiments can be combined to achieve beneficial effects. A person skilled in the art will be able to understand and implement other variant embodiments of the described embodiments after studying the drawings, the description and the claims. In the claims, the term "comprising" does not exclude other structures; a quantity referring to "one" does not exclude more than one; the terms "first", "second" are used to designate names and not to indicate any particular order. Any reference signs in the claims shall not be construed as limiting the protection scope. The mere presence of certain technical features in different dependent claims does not imply that these features cannot be combined to achieve beneficial effects.

What is claimed is:

1. A light-emitting panel, comprising:
    a substrate, and
    a plurality of light-emitting elements, a reflective layer and a protective layer that are disposed at a side of the substrate, wherein the reflective layer is located between the substrate and the protective layer; and
    wherein both the protective layer and the reflective layer are provided with openings, the substrate comprises bonding points within the openings, and the light-emitting elements are electrically connected to the bonding points.

2. The light-emitting panel according to claim 1, wherein the protective layer comprises at least one first layer with a first refractive index and at least one second layer with a second refractive index, and the first refractive index is different from the second refractive index.

3. The light-emitting panel according to claim 2, wherein the protective layer comprises one first layer and one second layer; and
    wherein in a direction perpendicular to a plane where the light-emitting panel is located, the first layer is disposed at a side of the second layer that is away from the substrate, and the second refractive index is greater than the first refractive index.

4. The light-emitting panel according to claim 2, wherein the protective layer comprises at least two first layers and at least two second layers; and
    wherein in a direction perpendicular to a plane where the light-emitting panel is located, the first layers and the second layers are alternately arranged.

5. The light-emitting panel according to claim 4, wherein in the direction perpendicular to the plane where the light-emitting panel is located, a layer in the protective layer that is closest to the substrate is the second layer and the second refractive index is greater than the first refractive index.

6. The light-emitting panel according to claim 2, wherein each of the first refractive index and the second refractive index has a value in a range of 1.4 to 2.0.

7. The light-emitting panel according to claim 2, wherein in a direction perpendicular to a plane where the light-emitting panel is located, a layer in the protective layer that is closest to the substrate is the second layer; and
    wherein a moisture absorption capability of a material of the first layer is greater than a moisture absorption capability of a material of the second layer and a moisture absorption capability of a material of the reflective layer, or an anti-oxidation capability of the material of the second layer is greater than an anti-oxidation capability of the material of the first layer and an anti-oxidation capability of the material of the reflective layer.

8. The light-emitting panel according to claim 2, wherein each first layer has a thickness in a range of 25 nm to 100 nm, or each second layer has a thickness in a range of 25 nm to 100 nm.

9. The light-emitting panel according to claim 2, wherein a material of the first layer is a transparent material or a translucent material, or a material of the second layer is a transparent material or a translucent material.

10. The light-emitting panel according to claim 2, wherein a material of the first layer comprises magnesium oxide or oxynitride, or a material of the second layer comprises silicon nitride, aluminum oxide, silicone, acrylic material, epoxy or oxynitride.

11. The light-emitting panel according to claim 10, wherein both the material of the first layer and the material of the second layer are the oxynitride, wherein the oxynitride comprises silicon oxynitride, and wherein a ratio of nitrogen to oxygen of the material of the first layer is smaller than a ratio of nitrogen to oxygen of the material of the second layer.

12. The light-emitting panel according to claim 1, wherein the light-emitting panel further comprises a planarization layer, and in a direction perpendicular to a plane where the light-emitting panel is located, the planarization layer is located between the protective layer and the reflective layer.

13. The light-emitting panel according to claim 12, wherein in the direction perpendicular to the plane where the light-emitting panel is located, the planarization layer has a thickness in a range of 5 μm to 20 μm.

14. The light-emitting panel according to claim 12, wherein a material of the planarization layer comprises a transparent material or a translucent material.

15. The light-emitting panel according to claim 1, wherein a plurality of light-condensing grooves are provided on the substrate, and in a direction perpendicular to a plane where the light-emitting panel is located, the light-condensing grooves are at least overlapped with the openings, and wherein the reflective layer and the protective layer are stacked and disposed on surfaces of the light-condensing grooves, and the bonding points are located within the light-condensing grooves.

16. The light-emitting panel according to claim 1, wherein the light-emitting panel further comprises a sealing layer, and in a direction perpendicular to a plane where the light-emitting panel is located, the sealing layer is disposed at a side of the protective layer that is away from the substrate; and
    wherein the sealing layer is provided with openings, and the openings of the sealing layer are at least overlapped with the openings of both the protective layer and the reflective layer.

17. The light-emitting panel according to claim 1, wherein the protective layer covers side faces of the reflective layer that are close to the bonding points.

18. A method for fabricating a light-emitting panel that comprises the light-emitting panel according to claim 1, the method comprising:
    providing a substrate on which bonding points are provided;
    forming a reflective layer at a side of the substrate where the bonding points are located;
    forming a protective layer at a side of the reflective layer that is away from the substrate, and forming openings on both the protective layer and the reflective layer to expose the bonding points; and
    electrically connecting light-emitting elements to the bonding points.

19. The method according to claim 18, wherein before electrically connecting the light-emitting elements to the bonding points, the method further comprises:

forming a sealing layer at a side of the protective layer that is away from the substrate, and forming openings on the sealing layer, wherein the openings of the sealing layer are at least overlapped with the openings of both the protective layer and the reflective layer to expose the bonding points.

20. A display device, comprising the light-emitting panel according to claim 1.

* * * * *